(12) United States Patent
Yamashita et al.

(10) Patent No.: US 6,316,943 B1
(45) Date of Patent: Nov. 13, 2001

(54) SIGNAL GENERATOR

(75) Inventors: Hideki Yamashita; Kazuyuki Yagi, both of Hyogo (JP)

(73) Assignee: Agilent Technologies, Inc., Loveland, CO (US)

( * ) Notice: Subject to any disclaimer, the term of this patent is extended or adjusted under 35 U.S.C. 154(b) by 0 days.

(21) Appl. No.: 09/469,541

(22) Filed: Dec. 22, 1999

Related U.S. Application Data

(62) Division of application No. 08/782,722, filed on Jan. 13, 1997, now Pat. No. 6,028,425.

(30) Foreign Application Priority Data

Jan. 26, 1996 (JP) .......................................... 8-11791

(51) Int. Cl.⁷ .............................. G01R 27/02; H03B 19/00
(52) U.S. Cl. ........................... 324/606; 324/120; 327/117
(58) Field of Search ..................................... 324/120, 605, 324/606, 607, 608, 73.1, 615, 616, 623; 331/56; 327/113, 114, 115, 116, 117, 118

(56) References Cited

U.S. PATENT DOCUMENTS

| | | | |
|---|---|---|---|
| 1,684,403 | * 9/1928 | Mason | 324/606 |
| 2,143,094 | * 1/1939 | Swift | 324/606 |
| 4,733,167 | * 3/1988 | Tamamura | 341/120 |
| 4,780,890 | * 10/1988 | Kane | 375/354 |
| 5,056,108 | * 10/1991 | Lund | 375/130 |

* cited by examiner

Primary Examiner—Ernest Karlsen

(57) ABSTRACT

Apparatus is described for generating a frequency-sweepable measurement signal and a local signal with a frequency separated from the measurement signal frequency by an intermediate frequency. The measurement signal and a local signal are generated by a simple structure, including a high-frequency variable-frequency signal source, a low-frequency fixed-frequency signal source, a first frequency divider and a second frequency divider. The variable-frequency signal source is a sweepable signal source. The first frequency divider divides an output frequency fa from the variable-frequency signal source by n and outputs a measurement signal with a frequency of fa/n. The signal of the variable-frequency signal source is also applied to the first input of the second frequency divider, and the signal of fixed-frequency signal source, with a frequency of fb, is applied to the second input. The second frequency divider removes a one period signal from the signal of the variable-frequency signal source each period of the signal of fixed-frequency signal source, thus obtaining a signal with a frequency of fa−fb. This latter signal is divided by n and a signal with a frequency of (fa−fb)/n is output as the local frequency. fb/n is the intermediate frequency.

3 Claims, 4 Drawing Sheets

SIGNAL GENERATOR

This application is a division of application Ser. No. 08/782,722 filed Jan. 13, 1997, now U.S. Pat. No. 6,028,425.

FIELD OF THE INVENTION

This invention relates to signal sources in general and, in particular, it concerns the generation of measurement signals and local signals in network analyzers.

BACKGROUND OF THE ART

Network analyzers measure frequency characteristics of circuit networks or circuit components by sweeping a measurement signal over a wide range. In order to measure frequency characteristics, a vector voltmeter which measures the amplitude and phase of the measurement signal, must be highly accurate over such a wide range. However, since it is difficult to make vector voltmeters with high accuracies over the entire range of measured frequencies, the measurement signal is generally converted to a constant frequency by a frequency conversion means (i.e., through a heterodyne method) and is then measured by the vector voltmeter.

FIG. 5 shows the most basic structure of a network analyzer which uses the heterodyne method. A signal source 10 comprises a measurement signal source 19 and a local signal source 20. Measurement signal source 19 generates a measurement signal and applies it to an object of measurement 15. Local signal source 20 generates a signal with a frequency that is separated from the measurement frequency by an intermediate frequency. The response signal, resulting from application of a signal to measurement object 15, and the signal from local signal source 20, are mixed by a mixer 16, converted to an intermediate frequency and output to a filter 17. Filter 17 enables passage of signal frequency components at the intermediate frequency. Vector voltmeter 18 measures the amplitude and phase of the measurement signal that has been converted to the intermediate frequency. Since vector voltmeter 18 performs measurements at the constant intermediate frequency, highly accurate measurements are achieved.

In applying the heterodyne method to a network analyzer, it is important to generate a local frequency that is accurately displaced with respect to the sweep measurement frequency by an amount of the intermediate frequency. FIG. 6 shows a prior art example of a method of generating the measurement frequency and the local frequency. FIG. 6 shows only signal source 10 part of FIG. 5.

FIG. 6 illustrates a first fixed-frequency signal source 21, a sweepable variable-frequency signal source 22, a second fixed-frequency signal source 23, a first mixer 24, a second mixer 25, a first filter 26, and a second filter 27. The signals of first fixed-frequency signal source 21, with a frequency fc, and variable-frequency signal source 22, with a frequency fd, are mixed by first mixer 24, and signals with the frequencies fd±fc are output. The fd+fc signal is removed by first filter 26, and the signal with frequency fd−fc is output as the measurement signal. Therefore, the frequency of the measurement signal varies according to changes in the frequency fd of variable-frequency signal source 22.

In the same manner, a frequency fd of variable-frequency signal source 22 and a frequency fe of second fixed-frequency signal source 23 are mixed by second mixer 25, and a frequency fd±fe is output. Second filter 27 removes the component with the frequency fd+fe, in the same manner as the first filter, and the signal with the frequency fd−fe is output as the local signal. The frequency of the local signal also varies according to the changes in the frequency fd of variable-frequency signal source 22.

The difference in the frequencies of the output signal of first filter 26 and second filter 27 is fc−fe; this is a constant frequency, without relation to the frequency of the measurement signal. Therefore, if the measurement signal and the local signal are mixed by mixer 16 of FIG. 5, an intermediate frequency signal with a constant frequency is output.

The prior art shown in FIG. 6 is an ingenious method for generating two sweep frequencies with a constant frequency difference, but it has the following drawbacks. First, a plurality of high-frequency signal sources, composed of complex circuits, are required. Further, since the desired frequencies are generated by mixing frequencies using a plurality of mixers, many frequency components other than the desired frequencies are generated. As a result, a complex means of removing errors due to these frequency components is required. Because of this complex circuit assembly, the prior art has the problem of high cost.

Accordingly, it is an object of this invention to provide a simple signal generation method, in order to reduce the cost of a network analyzer.

SUMMARY OF THE INVENTION

This invention employs a simple structure to generate a measurement signal and a local signal with a frequency that is displaced by an intermediate frequency from the frequency of the measurement signal. The structure includes one high-frequency variable-frequency signal source, one low-frequency fixed-frequency signal source, and two frequency dividers.

EXPLANATION OF SYMBOLS

Figure 1:
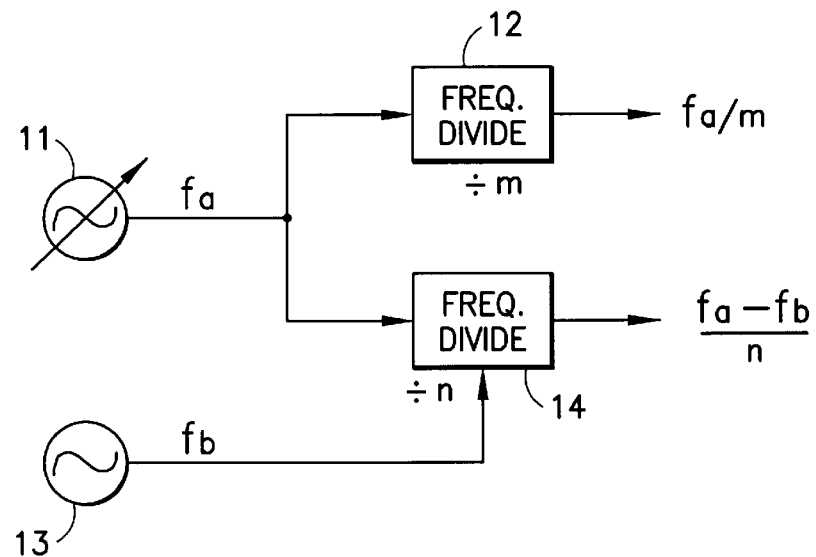
FIG. 1: Drawing showing an embodiment of this invention.

10: Signal source
11: Variable-frequency signal source
12: First frequency divider
13: Fixed-frequency signal source
14: Second frequency divider
15: Object of measurement
16: Mixer
17: Filter
18: Vector voltmeter
19: Measurement signal source
20: Local signal source 21: First fixed-frequency signal source
22: Variable-frequency signal source
23: Second fixed-frequency signal source
24: First mixer
25: Second mixer
26: First filter
27: Second filter
31: AND gate
32: Timing generator part
33: Frequency divider

DETAILED DESCRIPTION OF THE INVENTION

FIG. 1 shows an embodiment of this invention, which generates a measurement signal and a local signal. FIG. 1 includes: a variable-frequency signal source 11, a first frequency divider 12, a fixed-frequency signal source 13, and a second frequency divider 14.

Variable-frequency signal source 11 is a frequency-sweepable signal source which generates a high-frequency signal. First frequency divider 12 divides the output signal of variable-frequency signal source 11 (frequency fa) by m, outputting the result as a measurement signal with frequency fa/m.

The high-frequency output signal of variable frequency signal source 11 is also applied to the first input of second frequency divider 14, and the output signal of fixed-frequency signal source 13 (frequency fb) is applied to the second input. Second frequency divider 14 includes a pulse removal circuit and a counter/frequency divider circuit. The pulse removal circuit generates a signal wherein at least one period of the signal of the first input of the second frequency divider 14 has been removed, for each period of the signal applied to the second input. This signal is divided by n by a counting down of the counter/frequency divider circuit.

Figure 2:
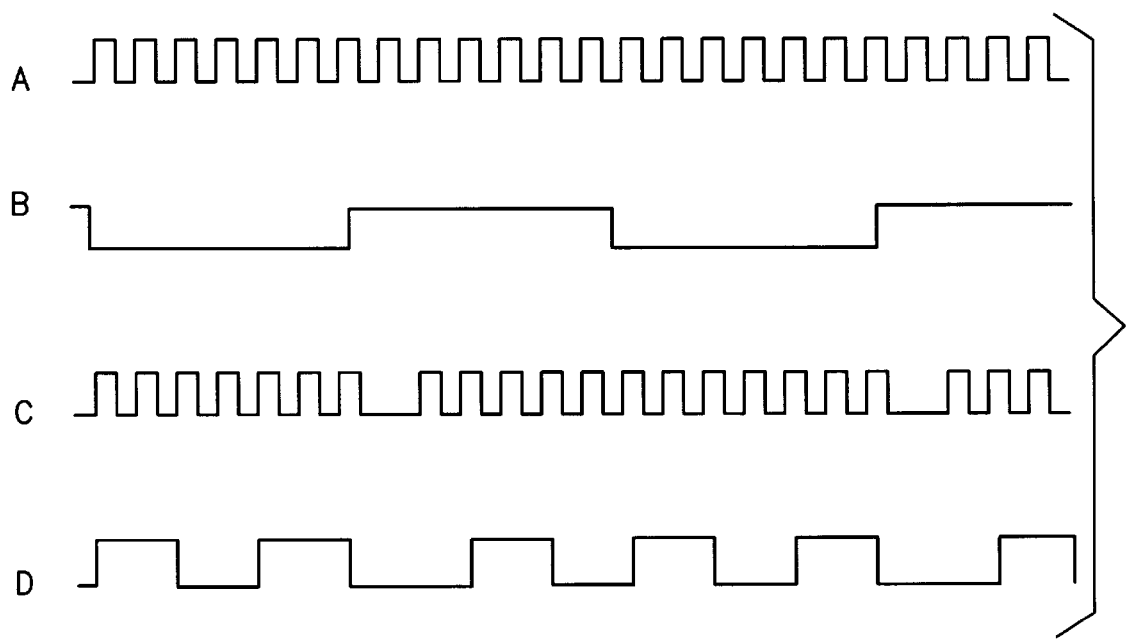
FIG. 2: Drawing showing an example of the signal waveform in a second frequency divider used in the invention.

FIG. 2 shows an example in which the pulse removal circuit of second frequency divider 14 removes the signal of one period of the first input signal and the counter circuit divides the frequency by 4. Signal A is the signal from variable-frequency signal source 11, i.e., the signal of the first input. Signal B is the signal from fixed-frequency signal source 13, i.e., the signal of the second input. Signal C is the waveform in which the pulse removal circuit has removed one period of signal A.

In FIG. 2, one period of the waveform of the first input is removed immediately after the rise of the signal of the second input. The waveform obtained when the counter circuit counts down the signal C and divides it by 4 is signal D. Signal C, with one period of signal A removed every period of signal B, has fa–fb periods per second, i.e., its frequency is fa–fb. Therefore, the frequency of signal D is (fa–fb)/4.

Figure 7:
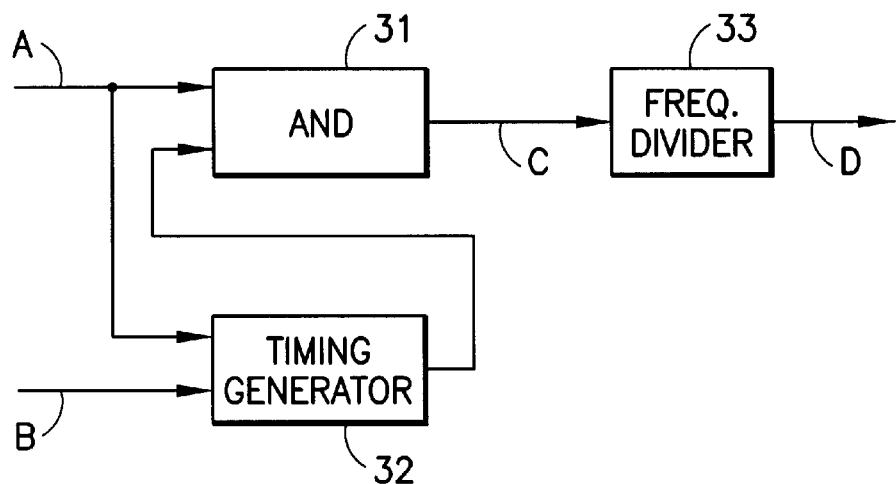
FIG. 7: Drawing showing an embodiment of the pulse removal circuit of this invention.

FIG. 7 shows an example of the structure of the pulse removal circuit and the counter/frequency divider circuit. Signals A and B are applied to a timing generator part 32. After the rise of signal B, the output during the first period of signal A becomes Low. After this, it is Hi. An AND gate 31 passes signal A when the output of timing generator part 32 is Hi. Moreover, when the output of timing generator part 32 is Low, the output of AND gate 31 is Low, and signal A does not pass. Therefore, the output of AND gate 31 becomes signal C, with one period of signal A removed. In the example of FIG. 2, this signal is divided by 4, by frequency divider 33, and signal D is outputted. Frequency divider 33 can be an ordinary digital counter.

As mentioned above, the output frequency of first frequency divider 12 is fa/m, and the output frequency of second frequency divider 14 is (fa–fb)/n. When the two frequency division ratios are equal (i.e., m=n), the frequency difference between the output frequencies of the first and second frequency dividers becomes fb/n, without relation to fa. Since fb is a fixed frequency, the frequency difference between the output frequencies of the first and second frequency dividers 12, 14 is constant, without relation to fa.

That is, if the frequency division ratios of the first and second frequency dividers are made equal; the output of the first frequency divider is made the measurement frequency; and the output of the second frequency divider is made the local frequency. The difference between the measurement signal and the local signal frequencies is constant, irrespective of the frequency of the measurement signal. If the frequency of fixed-frequency signal source 13 is made a frequency n times the desired intermediate frequency, the difference frequency becomes the intermediate frequency.

FIG. 2 shows an example in which one period of the signal of the first input is removed every period of the signal of the second input of the second frequency divider. It is clear that a similar result can be accomplished by removing a period of the signal of the first input an integral number of times per period of the signal of the second input, or once per an integral number of periods of the second signal.

Figure 3:
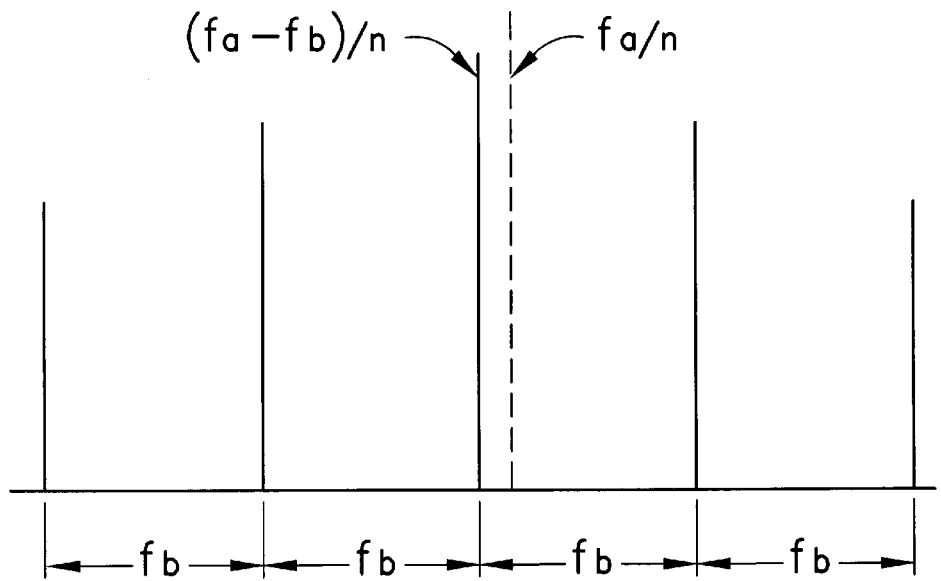
FIG. 3: Drawing showing an example of the output frequency spectrum of the second frequency divider.

Output signal D of second frequency divider 14 contains a signal with the period of signal B. Therefore, in addition to the frequency component (fa–fb)/n, frequency components appear in the output signal D of the second frequency divider, which are located at intervals of fb away from the central frequency of (fa–fb)/n. This is shown in FIG. 3. Therefore, if it is mixed with the fa/n signal, a signal is generated that has frequency components that are separated by integral multiples of fb, with the intermediate frequency fb/n as the center. These components with intervals of fb can be easily removed by filter 17, connected to the output end of mixer 16.

The frequency division ratio n may be any arbitrary integer, but if n becomes large, the frequencies of the variable-frequency signal source and the fixed-frequency signal source must be made high. Moreover, if n is small, the components that are an interval of fb away from the intermediate frequency, appearing in the output of mixer 16, become close to the intermediate frequency. Considering these facts, a frequency ratio n=4 is suitable in practice.

Figure 4:
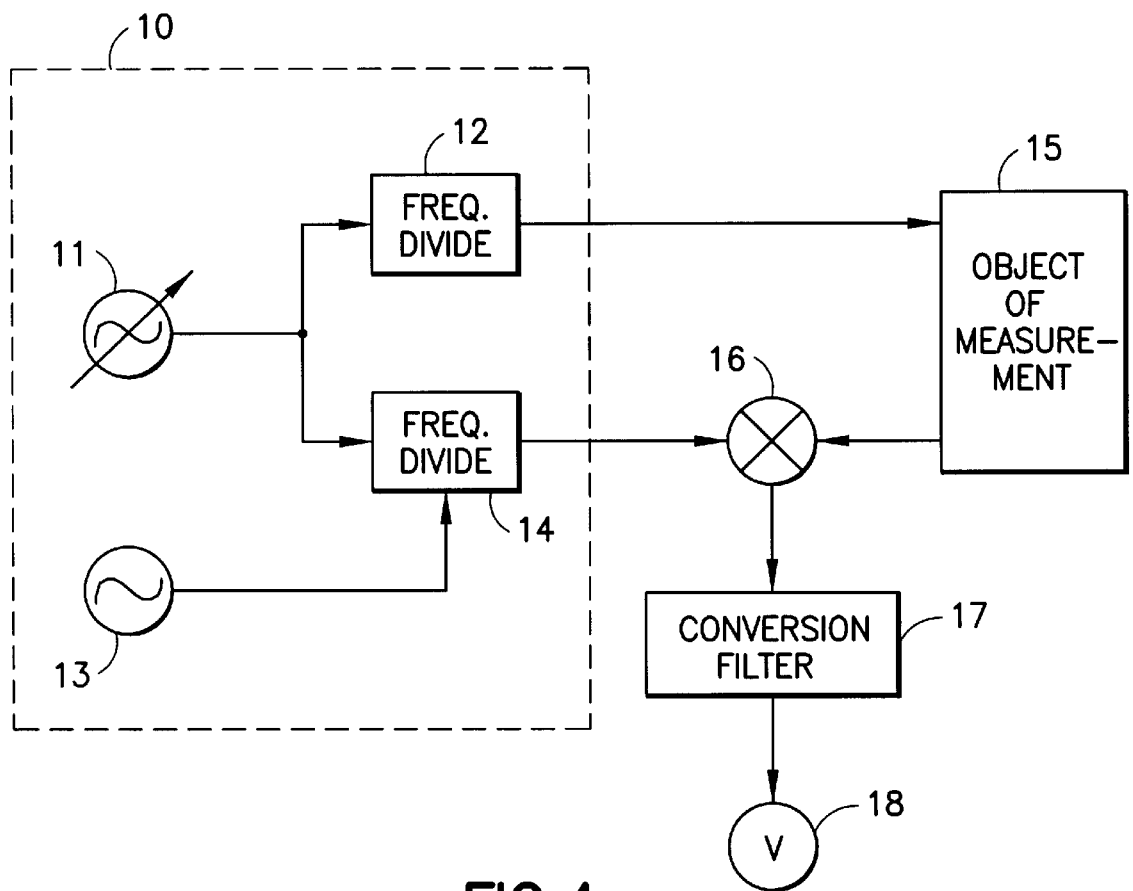
FIG. 4: Drawing showing an embodiment of the fundamental structure of a network analyzer incorporating the invention.
Figure 5:
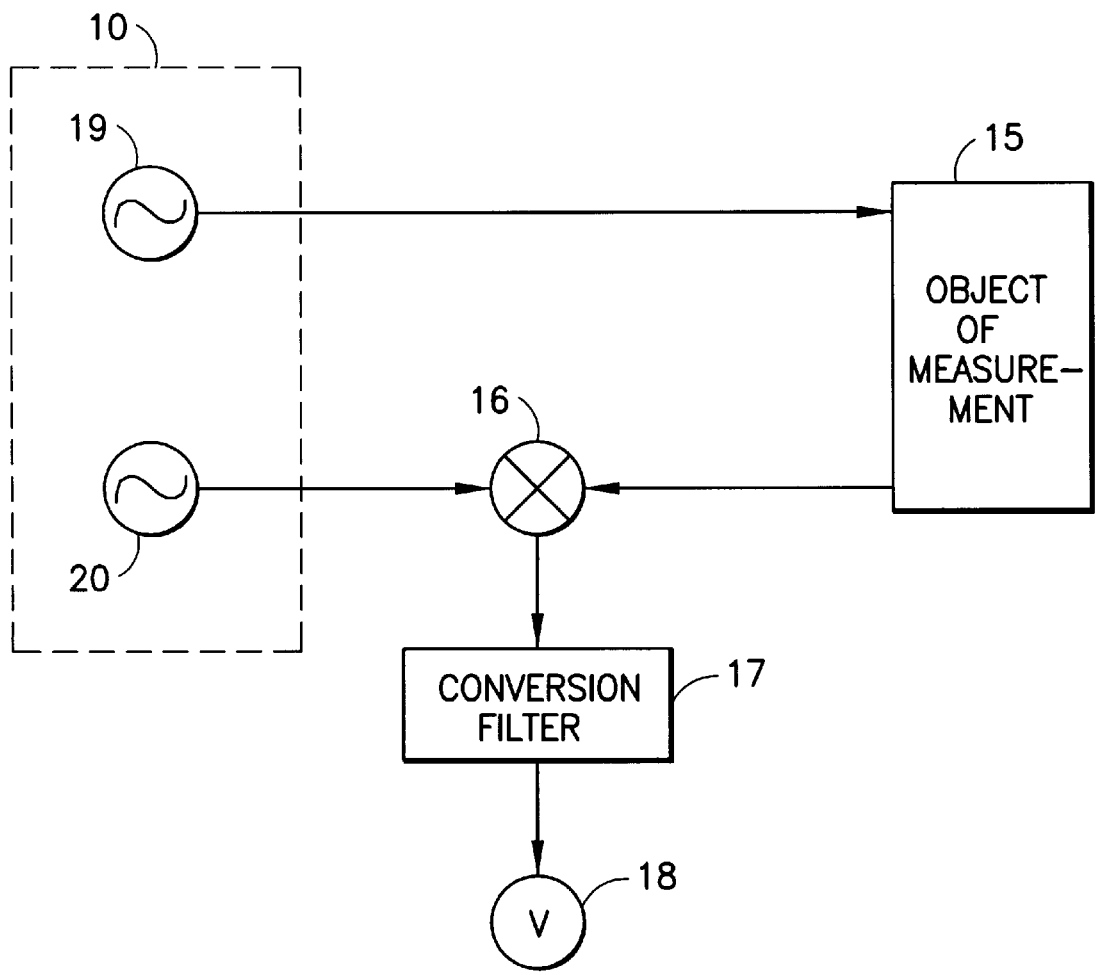
FIG. 5: Drawing showing an example of the fundamental structure of a network analyzer.
Figure 6:
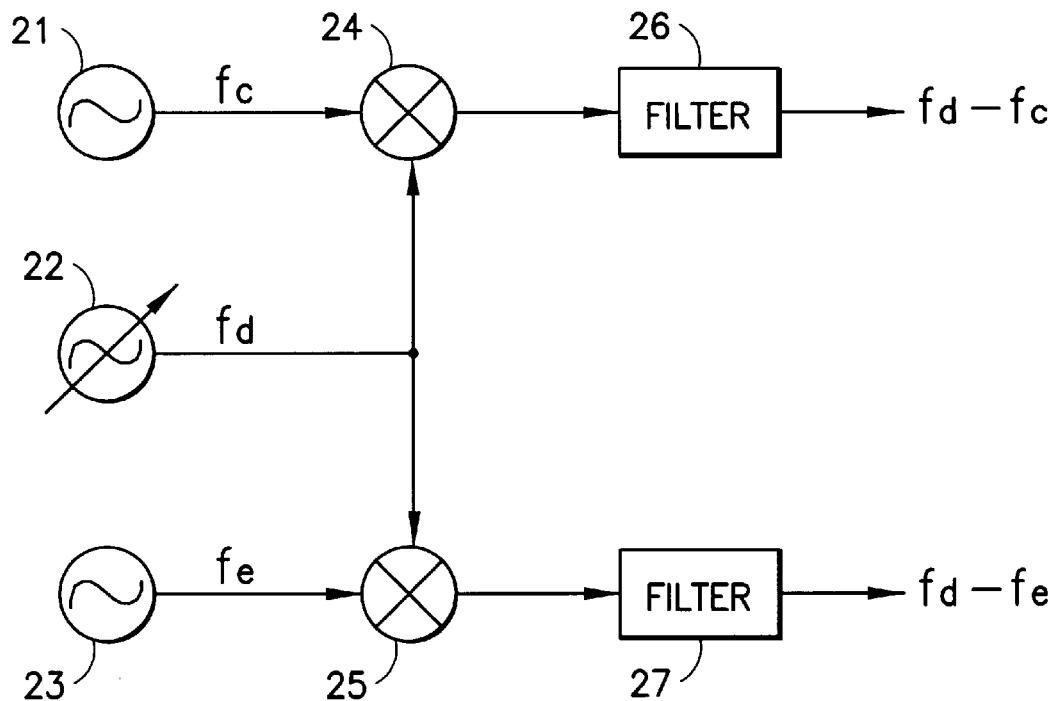
FIG. 6: Drawing showing an example of the principle of the generation of a measurement signal and a local signal according to the prior art.

FIG. 4 shows an example of a network analyzer that uses the signal generator of this invention. The signal generator of this invention can also be applied to impedance-measuring devices using the heterodyne method and other devices.

This invention thus enables a measurement signal and local signal sources to be constructed with simple circuits, and the number of parts is reduced by approximately 40%, as compared to the prior art. As a result, this invention has the practical effect of reducing costs.

Embodiments of this invention have been shown above, but one is not limited to the form, arrangement, and other aspects of these examples; if desired, changes in the structure of the invention are allowed, as long as the concept of the invention is not lost.

What is claimed is:

1. A device comprising:
    a first signal generator;
    a second signal generator;
    first frequency dividing means for dividing a frequency of an output signal of the first signal generator and applying a resultant signal to a device being measured;

second frequency dividing means including means for removing at least one signal period from the output signal of the first signal generator, based on an output signal from the second signal generator, and for dividing a frequency of an output signal from the means for removing; and mixer means for mixing the resultant signal of the second frequency dividing means and an output frequency from the device being measured and for generating an intermediate frequency signal therefrom.

2. A device in accordance with claim 1, wherein frequency division ratios of the first frequency dividing means and the second frequency dividing means are the same.

3. A device in accordance with claim 2, further comprising:

vector voltmeter means connected to an output of the mixer means.

* * * * *